(12) United States Patent
Iwamoto et al.

(10) Patent No.: US 9,997,470 B2
(45) Date of Patent: Jun. 12, 2018

(54) SEMICONDUCTOR DEVICE AND MANUFACTURING METHOD THEREOF

(71) Applicant: TOSHIBA MEMORY CORPORATION, Minato-ku, Tokyo (JP)

(72) Inventors: Masaji Iwamoto, Kanagawa (JP); Takashi Yamazaki, Kanagawa (JP)

(73) Assignee: TOSHIBA MEMORY CORPORATION, Tokyo (JP)

( * ) Notice: Subject to any disclaimer, the term of this patent is extended or adjusted under 35 U.S.C. 154(b) by 0 days. days.

(21) Appl. No.: 15/441,465

(22) Filed: Feb. 24, 2017

(65) Prior Publication Data

US 2017/0271271 A1   Sep. 21, 2017

(30) Foreign Application Priority Data

Mar. 17, 2016   (JP) .................. 2016-053322

(51) Int. Cl.
| | |
|---|---|
| *H01L 23/552* | (2006.01) |
| *H01L 21/56* | (2006.01) |
| *H01L 23/50* | (2006.01) |
| *H01L 23/00* | (2006.01) |

(52) U.S. Cl.
CPC ............ *H01L 23/552* (2013.01); *H01L 21/56* (2013.01); *H01L 23/50* (2013.01); *H01L 24/48* (2013.01); *H01L 24/49* (2013.01); *H01L 2224/48095* (2013.01); *H01L 2224/48175* (2013.01); *H01L 2224/49176* (2013.01)

(58) Field of Classification Search
None
See application file for complete search history.

(56) References Cited

U.S. PATENT DOCUMENTS

| | | | | |
|---|---|---|---|---|
| 8,766,429 | B2* | 7/2014 | Kim | H01L 25/105 |
| | | | | 257/659 |
| 9,818,698 | B2* | 11/2017 | Wang | H01L 23/552 |
| 2004/0238857 | A1 | 12/2004 | Beroz et al. | |
| 2009/0072360 | A1 | 3/2009 | Koga | |

(Continued)

FOREIGN PATENT DOCUMENTS

CN   104362131 A   2/2015

*Primary Examiner* — Ali Naraghi
(74) *Attorney, Agent, or Firm* — Foley & Lardner LLP

(57) ABSTRACT

Embodiments include a semiconductor manufacturing method comprising, providing an object to be processed, the object including a semiconductor element, a sealing resin layer sealing the semiconductor element, a ground terminal electrically connected to the semiconductor element and including a first protruding part protruding through a surface of the resin layer, and a signal terminal electrically connected to the semiconductor element and including a second protruding part protruding through the surface of the resin layer; positioning the object in a jig, wherein the jig covers the entire second protruding part of the signal terminal, and wherein the jig only partially covers the first protruding part of the ground terminal, such that at least a first portion of the first protruding part of the ground terminal is left uncovered by the jig; while the object is positioned in the jig, fabricating a conductive shield layer on the resin layer and at least some of the first portion of the first protruding part of the ground terminal, such that the shield layer is electrically connected to ground terminal.

15 Claims, 2 Drawing Sheets

(56) References Cited

U.S. PATENT DOCUMENTS

| | | |
|---|---|---|
| 2015/0171056 A1 | 6/2015 | Goto et al. |
| 2015/0325530 A1* | 11/2015 | Yamada ................ H01L 21/561 |
| | | 257/659 |
| 2016/0254236 A1* | 9/2016 | Kim .................... H01L 23/3114 |
| | | 257/659 |
| 2017/0256474 A1* | 9/2017 | Fujinaga ............. H01L 23/3675 |
| 2017/0309576 A1* | 10/2017 | Kawabata ............. H01L 23/552 |

* cited by examiner

SEMICONDUCTOR DEVICE AND MANUFACTURING METHOD THEREOF

CROSS-REFERENCE TO RELATED APPLICATION

This application is based upon and claims the benefit of priority from Japanese Patent Application No. 2016-053322, filed Mar. 17, 2016, the entire contents of which are incorporated herein by reference.

FIELD

Embodiments described herein relate generally to a semiconductor device and a manufacturing method thereof.

BACKGROUND

Insertion mount technology is a manufacturing method for a semiconductor device.

DETAILED DESCRIPTION

Figure 1:
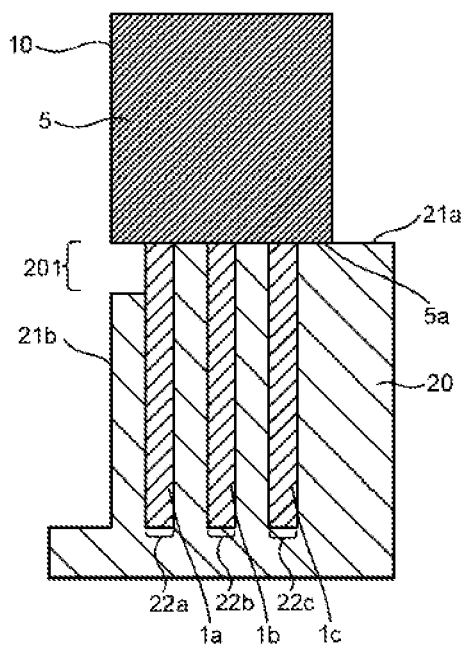
FIG. 1 is a schematic figure explaining a placing operation.

Embodiments provide a semiconductor device with high resistivity to the electromagnetic interference.

According to one of the embodiment, a semiconductor manufacturing method comprising providing an object to be processed, the object including a semiconductor element, a sealing resin layer sealing the semiconductor element, a ground terminal electrically connected to the semiconductor element and including a first protruding part protruding through a surface of the resin layer, and a signal terminal electrically connected to the semiconductor element and including a second protruding part protruding through the surface of the resin layer; positioning the object in a jig, wherein the jig covers the entire second protruding part of the signal terminal, and wherein the jig only partially covers the first protruding part of the ground terminal, such that at least a first portion of the first protruding part of the ground terminal is left uncovered by the jig; while the object is positioned in the jig, fabricating a conductive shield layer on the resin layer and at least some of the first portion of the first protruding part of the ground terminal, such that the shield layer is electrically connected to ground terminal.

Hereinafter, embodiments of the invention will be described with reference to the accompanying drawings. In the following embodiment description, the figures are schematic, and the number, the thickness, the width, the ratio of each element may differ from what is depicted. Components with substantially the same functionalities and configurations will be referred to with the same reference numeral, and repeated description may be omitted.

As an example explaining a manufacturing method of a semiconductor device, the manufacturing method of the insertion mount type semiconductor device will be described. This manufacturing method includes a placing operation and a shield operation.

FIG. 1 shows a schematic figure for explaining a placing (positioning) operation. As shown in FIG. 1, in the placing operation, a processed object (to be processed) 10 and a jig 20 are provided (placed) overlapping each other. Both are transferred to an operation chamber (not shown in figure) which performs a shield operation.

The processed object 10 will be described. The processed object 10 is an insertion mount type semiconductor device. For example, the processed object 10 is a discrete semiconductor device such as a MOSFET or a regulator. The processed object 10 is not limited to the discrete semiconductor device. The processed object 10 may be an insertion mount type semiconductor device having external connection terminals on only one plane thereof.

Figure 2:
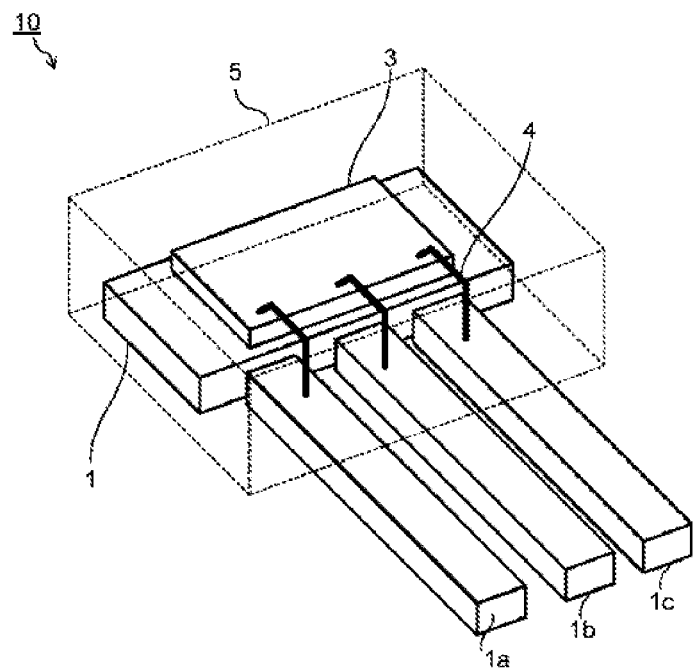
FIG. 2 is a schematic figure explaining a configuration of the processing target.

FIG. 2 shows a schematic figure for explaining an exemplary configuration of the processing target 10. As shown in FIG. 2, the processed object 10 comprises a substrate 1 having external connection terminals 1a to 1c, a semiconductor element 3, bonding wires 4 and a sealing resin layer 5.

The substrate 1 comprises, for example, a lead frame. The lead frame comprises, for example, copper, copper alloy or iron and nickel alloy such as 42 alloy.

The external connection terminals 1a to 1c protrude from a surface 5a of the sealing resin layer 5. In other words, each of the external connection terminals 1a to 1c includes a protruding part protruding from the sealing resin layer 5. This surface 5a is referred to as a protruding surface of the external connection terminals 1a to 1c. Although the external connection terminals 1a to 1c in FIG. 2 extend in a direction perpendicular to the surface 5a, the configuration of the external connection terminals 1a to 1c are not limited as such. The external connection terminals 1a to 1c may have a solder plating layer. According to the solder plating layer, the oxidation of the external connection terminals 1a to 1c can be suppressed.

The external connection terminal 1a functions as a ground terminal. The ground terminal means a terminal configured to be able to connect a ground voltage when the semiconductor device is connected to other electronic components. The external connection terminal 1b functions, for example, as an input terminal. The external connection terminal 1c functions, for example, as an output terminal. For example, when the processed object 10 is a MOSFET, the external connection terminal 1a is electrically connected to one of source or drain nodes, the external connection terminal 1b is electrically connected to a gate node, and the external connection terminal 1c is electrically connected to other of source or drain nodes. Additionally the number and position of the external connection is not limited to FIG. 1 and FIG. 2. The position of the external terminals 1a to 1c may be interchangeable. In addition, the processed object 10 may further comprise an external terminal functioning as a power supply terminal.

A circuit board may be used as the substrate 1. The circuit board comprises, for example, a plurality of connection pads, which include first to third connection pads, on the first plane. The first connection pad is, for example, electrically connected to a ground wiring. The second connection pad is, for example, electrically connected to an input signal wiring. The third connection pad is, for example, electrically connected to an output signal wiring. The external connection terminal 1a is electrically connected to the first connection pad. The external connection terminal 1b is electrically connected to the second connection pad. The external connection terminal 1c is electrically connected to the third connection pad.

The semiconductor element 3 is provided on the substrate 1. The semiconductor element 3 is electrically connected to the external connection terminals 1a to 1c via a plurality of bonding wires 4 respectively. The semiconductor element 3 is, for example, a semiconductor chip. Additionally, the plurality of semiconductor chips may be used as the semiconductor element 3. Bonding wire 4 is, for example, gold wire, silver wire or copper wire. A surface of the copper wire may be covered by palladium film.

The sealing resin layer 5 seals the semiconductor element 3. In addition, the sealing resin layer 5 also seals the connection portion between the bonding wire 4 and the external connection terminals 1a to 1c, and the connection portion between the semiconductor element 3 and the external connection terminals 1a to 1c. The shape of the sealing resin layer 5 is, for example, a cuboid having a periphery surface including the surface 5a. The sealing resin layer 5 comprises inorganic fillers like silicon oxide. The inorganic fillers are, for example, granular and have a function to adjust viscosity and hardness of the sealing resin layer 5. The content of the inorganic fillers in the sealing resin layer 5 is, for example 60%~90%. The sealing resin layer 5 comprises the mixture of the inorganic fillers and an insulating organic resin material. The organic resin material is, for example, epoxy resin.

The jig 20 will be described. The jig 20 has a periphery surface including a surface 21a and a surface 21b, a trench 22a, a trench 22b and a trench 22c. The jig 20 is fabricated from, for example, metal material and resin material.

The surface 21a is, for example, an upper surface of the jig 20. The surface 21a is configured to be able to face the processed object. The surface 21b is, for example, a side surface of the jig 20. The trench 22a is exposed in the surface 21a and has a depth in the thickness direction of the jig 20. The trench 22a has an exposure portion 201 exposed continuously from the surface 21a to the surface 21b. That is, a side of the exposure portion 201 is not covered by the jig. Both of trench 22b and 22c are exposed in the surface 21a and have respective depths in the thickness direction of the jig 20. The depth or the width of the trench 22a to 22c are designed depending on the length or width of the external connection terminals 1a to 1c for any particular configuration. The depth and/or the width of the trench 22a to 22c may be the same to each other or different from each other.

In a placing operation, the processed object 10 and the jig 20 are provided in the manner that the external connection terminal 1a is inserted into the trench 22a, the external connection terminal 1b is inserted into the trench 22b, the external connection terminal 1c is inserted into the trench 22c and the surface 5a of the sealing resin layer 5 contacts the surface 21a of the jig 20. At this time, a portion of the protruding part of the external connection terminal 1a is exposed, shown as the exposure portion 201. Thus, when viewed from a direction perpendicular to the surface 21b, the part of the external connection terminal 1a is not covered by the jig 20. In contrast to connection terminal 1a, the external connection terminal 1b and 1c are covered by the sealing resin layer 5 and the jig 20.

Figure 3:
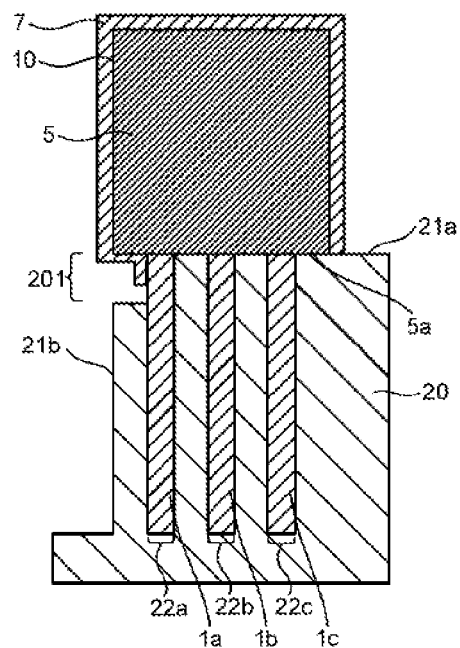
FIG. 3 is a schematic figure explaining a shield operation.

FIG. 3 is a schematic cross sectional figure for explaining a shield operation. As shown in FIG. 3, a conductive shield layer 7 is formed on both the exposure portion of the periphery surface of the sealing resin layer 5 and the exposure portion 201 of the external connection terminal 1a.

Since the exposure portion of the external connection portion 1a is exposed at the exposure portion 201, the external connection terminal 1a electrically connects to a part of the conductive shield layer 7 on the exposure portion 201 of the external connection terminal 1a, and the conductive shield layer 7 on the periphery surface of the sealing resin layer 5.

The conductive shield layer 7 covers the periphery surface of the sealing resin layer 5 beyond the surface 5a and at least some of the portion of the protruding part of the surface 5a, which is exposed at the beginning of the shielding operation. The conductive shield layer 7 further also covers at least some portion of the protruding part of the external connection terminal 1a, which is exposed at the beginning of the shielding operation. If the conductive shield layer 7 is provided on the whole of the external terminal 1a, there may be a negative effect during a solder operation in which the semiconductor element is mounted on the substrate. Thus, it is preferred that the conductive shield layer 7 is provided only on a part of the external connection terminal 1a. In addition, since the external connection terminals 1b and 1c are covered by the jig 20, the conductive shield layer 7 is not formed on the surface of the external connection terminals 1b and 1c. Thus, the conductive shield layer 7 is separated physically and electrically from the external connection terminals 1b and 1c.

The conductive shield layer 7 can shield against the electromagnetic wave radiated from the semiconductor element 3 and other elements and suppress the leak of the electromagnetic wave to the outside. Since the external connection terminal 1a electrically connects to the conductive shield layer 7, the conductive shield layer 7 suppresses the leak of the electromagnetic wave more efficiently.

The conductive shield layer 7 comprises, for example, metal such as copper, nickel, titan, gold, silver, palladium, platinum, iron, aluminum, tin or chromium, metal alloy thereof, stainless steel, indium tin oxide (ITO). For example, when the conductive shield layer 7 is copper, the electrical resistivity of the conductive shield layer 7 can be reduced. The conductive shield 7 may comprises the stacked layer. The conductive shield layer 7 is fabricated by, for example, sputtering method. Evaporation method, spray method or plating method may be used for fabricating the conductive shield layer 7.

The thickness of the conductive shield layer 7 may be determined depending on the electrical resistivity thereof. For example, the thickness that make the sheet resistance, which is calculated by dividing the electrical resistivity by the thickness, equal or less than 0.5 ohm/square is preferred. When the sheet resistance is equal or less than 0.5 ohm/square, the suppression of the leak of the electromagnetic wave can be well reproducible. The thickness is preferred to be equal or more than 0.1 um and equal or less than 20 um. When the thickness is less than 0.1 um, there is a possibility the effect of suppression largely decreased. When the thickness is larger than 20 um, the stress of the conductive shield layer 7 becomes large so that there is a possibility that the conductive shield layer 7 is peeled off. Additionally, when the conductive shield layer 7 is fabricated by the sputtering method, there is a possibility that the thickness of the region contacting the surface 5a is thinner than that of the other region.

According to the manufacturing method of this embodiment, the conductive shield layer is fabricated covering not only the sealing resin layer but also at least some of the portion of a protruding part of the external connection terminal, which is configured to be able to function as a ground terminal, by using a jig having at least a trench that continuously expose in two or more planes. A ground terminal electrically connects to a conductive shield layer via this conductive shield layer.

According to the semiconductor device of the insertion mount type, the external connection terminal protrude from the sealing resin layer. Thus, if the conductive shield layer is fabricated without the jig by sputtering method, plating method or the similar method, there is a possibility that a part of the conductive shield layer is fabricated on the other external connection terminal except the ground terminal. In this case, short circuit may be occurred. For preventing short circuit, an additional masking operation is necessary. This additional masking operation increases cost.

According to the manufacturing method of this embodiment, when the conductive shield layer is fabricated, the other external connection terminal(s), which is configured to be able to function a signal terminal(s), are covered by the jig. Thus, the possibility of the short circuit between the other external connection terminal(s) and the conductive shield layer can be reduced. That avoids increasing (i.e., reduces) operations like the masking operation. Additionally the conductive shield layer may be formed on a plurality of processed objects at a same shield operation by using a zig having a plurality of trench for the plurality of processed objects.

The manufacturing method of this embodiment may further comprise a processed object formation operation, which fabricates the processed object, before the placing operation. The processed object operation comprises a substrate preparation operation, a mount operation, a resin sealing operation, a cutting operation and a plating operation.

The substrate preparation operation is an operation during which the substrate 1 having external connection terminals 1a to 1c are prepared. The mount operation is an operation during which the semiconductor element 3 is mounted on the substrate 1 and the semiconductor element 3 is electrically connected to the external connection terminals 1a to 1c respectively. During the mount operation, a bonding operation is performed. During the bonding operation, the semiconductor element 3 is electrically connected to the external connection terminals 1a to 1c respectively by bonding wire 4. In addition, during the mount operation, a heat treatment may be performed after the mounting the semiconductor element 3.

The sealing operation is an operation during which the sealing resin layer 5 is fabricated so that a substrate 1, a semiconductor element 3, a connection portion between the semiconductor element 3 and the external connection terminals 1a to 1c are sealed. The sealing operation is performed using the mixture of inorganic filler and organic resin by, for example, a transfer mold method, compression mold method, injection mold method, a sheet mold method or a resin dispense method.

The plating operation is an operation during which a solder plating layer is fabricated on the surface of the exposure portion of the external connection terminals 1a to 1c by a plating method. During the plating operation, electroplating is performed using, for example, solder bump material including tin.

Additionally, in addition to above operation, a marking operation may be performed. During the marking operation the product information including the name of the product is engraved. Since the shield operation is performed after the marking operation, the visibility of the engraved letter can be improved.

Figure 4:
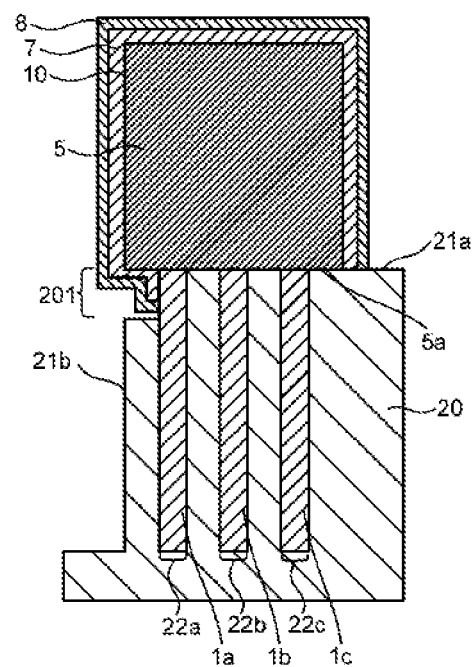
FIG. 4 is a schematic figure explaining a formation operation of a protective layer.

The manufacturing method of this embodiment may further comprise a protective layer formation operation in which a protective layer is fabricated after the shield operation. FIG. 4 is a schematic cross sectional figure for explaining the protective layer formation operation. As shown in FIG. 4, during the protective layer formation operation, a protective layer 8 is fabricated on the conductive shield layer 7. The protective layer 8 may contact some portion of the protruding part of the external connection terminal 1a.

Since the protective layer 8 has, for example, corrosion resistance, migration resistance or moisture resistance, the protective layer can suppress the corrosion of the conductive shield layer 7. For example, the protective layer 8 comprises metal material, organic material or ceramic material. For example, the protective layer 8 comprises titan, chromium, nickel, iron, aluminum, molybdenum, tantalum, manganese, lanthanum, copper, stainless steel, the oxide of the above metal, the nitride of the above metal, ITO, carbon, graphite, diamond like carbon, zirconium boride, molybdenum disulfide, titanium oxynitride, titanium aluminum nitride, epoxy resin, polyimide resin, acrylic resin, silicone resin, polyamide resin and so on. The protective layer 8 may be fabricated, for example, by a method applicable to the fabrication of the conductive shield layer 7.

While certain embodiments have been described, these embodiments have been presented by way of example only, and are not intended to limit the scope of the inventions. Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modifications as would fall within the scope and spirit of the inventions.

What is claimed is:

1. A semiconductor manufacturing method comprising: placing an object to be processed into a jig, the object comprising a semiconductor element, a sealing resin layer sealing the semiconductor element, a ground terminal electrically connected to the semiconductor element and protruding through a surface of the sealing resin layer, and a signal terminal electrically connected to the semiconductor element and protruding through the surface of the sealing resin layer, the jig comprising a top surface, a side surface, a first trench exposed continuously from the top surface to the side surface and a second trench exposed in the top surface and not exposed in the side surface, fabricating a conductive shield layer on the resin layer and on a part of the ground terminal, the conductive layer electrically connected to ground terminal, wherein, during the fabricating, the ground terminal is inserted into the first trench, the signal terminal is inserted into the second trench, and the surface of the sealing resin layer contacts the top surface of the jig.

2. The semiconductor manufacturing method according to claim 1, further comprising:
   forming the object before the placing, the forming comprising
      mounting the semiconductor element on a substrate, electrically connecting the semiconductor element to the ground terminal and the signal terminal, respectively,
      fabricating the sealing resin layer to seal the semiconductor element, a connection portion between the semiconductor element and the ground terminal, and a connection portion between the semiconductor element and the signal terminal, and
      plating a protruding portion of the ground terminal and a protruding portion of the signal terminal.

3. The semiconductor manufacturing method according to claim 2, wherein the conductive shield layer is fabricated by one of a sputtering method, a spray method, an evaporation method or a plating method.

4. The semiconductor manufacturing method according to claim 1, wherein the conductive shield layer is fabricated by one of a sputtering method, a spray method, an evaporation method or a plating method.

5. The semiconductor manufacturing method according to claim 1, wherein the semiconductor element is single line package type.

6. The semiconductor manufacturing method according to claim 1, wherein the jig further comprises additional three side surfaces and the first trench does not expose the additional three side surfaces.

7. A semiconductor device comprising:
a semiconductor element,
a sealing resin layer sealing the semiconductor element;
a ground terminal electrically connected to the semiconductor element and protruding from a surface of the sealing resin layer;
a signal terminal electrically connected to the semiconductor element and protruding from the surface of the sealing resin layer; and
a conductive shield layer substantially covering an outside surface of the sealing resin layer and a part of the ground terminal.

8. A semiconductor manufacturing method comprising:
providing an object to be processed, the object including
a semiconductor element,
a sealing resin layer sealing the semiconductor element,
a ground terminal electrically connected to the semiconductor element and including a first protruding part protruding through a surface of the resin layer, and
a signal terminal electrically connected to the semiconductor element and including a second protruding part protruding through the surface of the resin layer;
positioning the object in a jig, wherein the jig covers the entire second protruding part of the signal terminal, and wherein the jig only partially covers the first protruding part of the ground terminal, such that at least a first portion of the first protruding part of the ground terminal is left uncovered by the jig;
while the object is positioned in the jig, fabricating a conductive shield layer on the resin layer and at least some of the first portion of the first protruding part of the ground terminal, such that the shield layer is electrically connected to ground terminal.

9. The semiconductor manufacturing method according to claim 8, further comprising:
forming the object before the placing, the forming including
mounting the semiconductor element on a substrate,
electrically connecting the semiconductor element to the ground terminal and the signal terminal, respectively,
fabricating the sealing resin layer sealing the semiconductor element, a connection portion between the semiconductor element and the ground terminal, and a connection portion between the semiconductor element and the signal terminal, and
plating a protruding portion of the ground terminal and a protruding portion of the signal terminal.

10. The semiconductor manufacturing method according to claim 8, wherein the conductive shield layer is fabricated by one of a sputtering method, a spray method, an evaporation method or a plating method.

11. The semiconductor manufacturing method according to claim 9, wherein the conductive shield layer is fabricated by one of a sputtering method, a spray method, an evaporation method or a plating method.

12. The semiconductor manufacturing method according to claim 8, wherein the semiconductor element is single line package type.

13. The semiconductor manufacturing method according to claim 8, wherein the jig comprises a top surface, a side surface, a first trench exposing continuously from the top surface to the side surface, and a second trench exposed in the top surface and not exposed in the side surface.

14. The semiconductor manufacturing method according to claim 8, wherein the conductive shield layer only partially covers the first portion of the first protruding part of the ground terminal.

15. The semiconductor manufacturing method according to claim 14, further comprising forming a protective layer covering the conductive shield layer at least where the conductive shield layer is fabricated on the resin layer and the at least some of the first portion of the first protruding part of the ground terminal.

* * * * *